US005537077A

United States Patent [19]

Schnizlein

[11] Patent Number: 5,537,077

[45] Date of Patent: Jul. 16, 1996

[54] POWER SUPPLY DEPENDENT METHOD OF CONTROLLING A CHARGE PUMP

[75] Inventor: Paul G. Schnizlein, Austin, Tex.

[73] Assignee: Advanced Micro Devices, Inc., Sunnyvale, Calif.

[21] Appl. No.: 511,421

[22] Filed: Aug. 4, 1995

Related U.S. Application Data

[62] Division of Ser. No. 363,485, Dec. 23, 1994.

[51] Int. Cl.[6] .......... H03L 5/00

[52] U.S. Cl. .......... 327/589; 327/331; 327/143; 327/536; 326/80

[58] Field of Search .......... 327/530, 535, 327/536, 537, 538, 540, 541, 544, 545, 143, 198, 390, 589, 99, 306, 309, 321, 331; 326/80, 81

[56] References Cited

U.S. PATENT DOCUMENTS

| | | | |
|---|---|---|---|
| 4,142,118 | 2/1979 | Guritz | 307/358 |
| 4,451,748 | 5/1984 | Amrany | 327/390 |
| 4,890,020 | 12/1989 | Bird | 327/429 |
| 4,896,297 | 1/1990 | Miyatake et al. | 327/390 |
| 5,029,282 | 7/1991 | Ito | 327/536 |
| 5,039,877 | 8/1991 | Chern | 327/536 |
| 5,132,556 | 7/1992 | Cheng | 307/296.7 |
| 5,144,159 | 9/1992 | Frisch et al. | 307/272.3 |
| 5,170,072 | 12/1992 | Ihara | 327/306 |
| 5,202,587 | 4/1993 | McLaury | 327/536 |
| 5,214,316 | 5/1993 | Nagai | 307/272.3 |
| 5,248,906 | 9/1993 | Mahmood | 307/443 |
| 5,260,646 | 11/1993 | Ong | 323/349 |
| 5,321,319 | 6/1994 | Mahmood | 307/443 |
| 5,359,552 | 10/1994 | Dhong et al. | 365/189.09 |
| 5,365,118 | 11/1994 | Wilcox | 327/390 |
| 5,378,936 | 1/1995 | Kokubo et al. | 327/77 |
| 5,396,118 | 3/1995 | Yaguchi | 327/516 |
| 5,455,526 | 10/1995 | Runas | 326/81 |
| 5,455,532 | 10/1995 | Bass | 326/80 |
| 5,477,172 | 12/1995 | Schnizlein | 326/81 |
| 5,483,486 | 1/1996 | Javanifard et al. | 365/185.17 |

*Primary Examiner*—Timothy P. Callahan
*Assistant Examiner*—My-Trang Nu Ton
*Attorney, Agent, or Firm*—Fulbright & Jaworski

[57] ABSTRACT

A supply voltage detect circuit is described which generates a control signal indicating the status of VCC to be at 5.0 or 3.3 volts. This control signal is used to generate analog reference signals used by A/D and/or D/A circuitry in an audio processing integrated circuit and by other circuitry to control clock frequencies or current drive.

2 Claims, 9 Drawing Sheets

POWER SUPPLY DEPENDENT METHOD OF CONTROLLING A CHARGE PUMP

This application is a divisional of application Ser. No. 08/363,485, filed Dec. 23, 1994, pending.

BACKGROUND OF THE INVENTION

1. Field of the Invention

This invention relates to a power supply voltage detect circuit. More particularly, this invention relates to a voltage detect circuit for a 3.3/5.0 volt supply voltage in a monolithic integrated audio processing circuit.

2. Brief Description of the Related Technology

The rapid demand for CD audio quality sound within personal computers, PCs, and the transition of power supply levels from 5.0 volts to 3.3 volts has placed compromising decisions on integrated circuit implementations, especially within mixed analog and digital circuits. In the present transitional period, where PCs are changing from 5.0 volt to 3.3 volt operating systems, the requirements on integrated circuits are becoming increasingly more difficult. Manufacturers require that the same chip work in both 3.3 volt and 5.0 volt supply systems, which requires that circuits must operate over a much greater supply range without having any reduction in audio performance. Since integrated circuit devices are being incorporated into both 5.0 volt supply systems (desk tops or work stations) and 3.3 volt systems (lap tops), the need exists for a VCC detect circuit and method for setting analog reference voltages within the audio processing circuitry to compensate for the change from one supply system to the other to maintain the integrity of the audio processing circuitry.

Typically, for 5.0 volt systems, the integrated circuit designer will use smaller physical device sizes to implement integrated circuits to optimize speed and power consumption and to limit substrate noise injection due to rush-through current effects. For a 3.3 volt system, the integrated circuit designer will increase the physical device sizes, or the gate drive, of the digital logic to meet the same timing requirements as required by the 5.0 volt system.

Design tradeoffs for the analog circuitry within the audio processing circuitry are similar to those for the digital circuitry since the designer seeks optimum dynamic range and audio quality performance. Typically, larger full scale reference levels are established for a 5.0 volt system than for a 3.3 volt system. Analog operational amplifiers for audio signals can provide greater voltage swings with a higher power supply level, hence without compensation at the 3.3 volt level, the signal to noise ratio at 5.0 volts is superior to that at 3.3 volts. Compensation at 3.3 volts is necessary to improve the overall audio dynamic range and thus, performance.

The present invention addresses this problem within a mixed analog and digital audio circuitry environment.

SUMMARY OF THE INVENTION

The present invention is for a voltage detect circuit that senses whether a 3.3 volt or 5.0 volt supply voltage is being used and then generates a logic level control signal which is used to set analog reference voltage values for A/D and D/A circuitry on an audio processing integrated circuit. The control signal is also used to: (1) adjust the drive strength of clock driver circuitry; (2) adjust the delay in a non-overlap clock generator; (3) adjust the delay of delay critical memory signals; (4) select an I/O buffer input buffer circuit voltage threshold level; and (5) control other circuitry as described herein.

DETAILED DESCRIPTION OF THE PREFERRED EMBODIMENT

Figure 1:
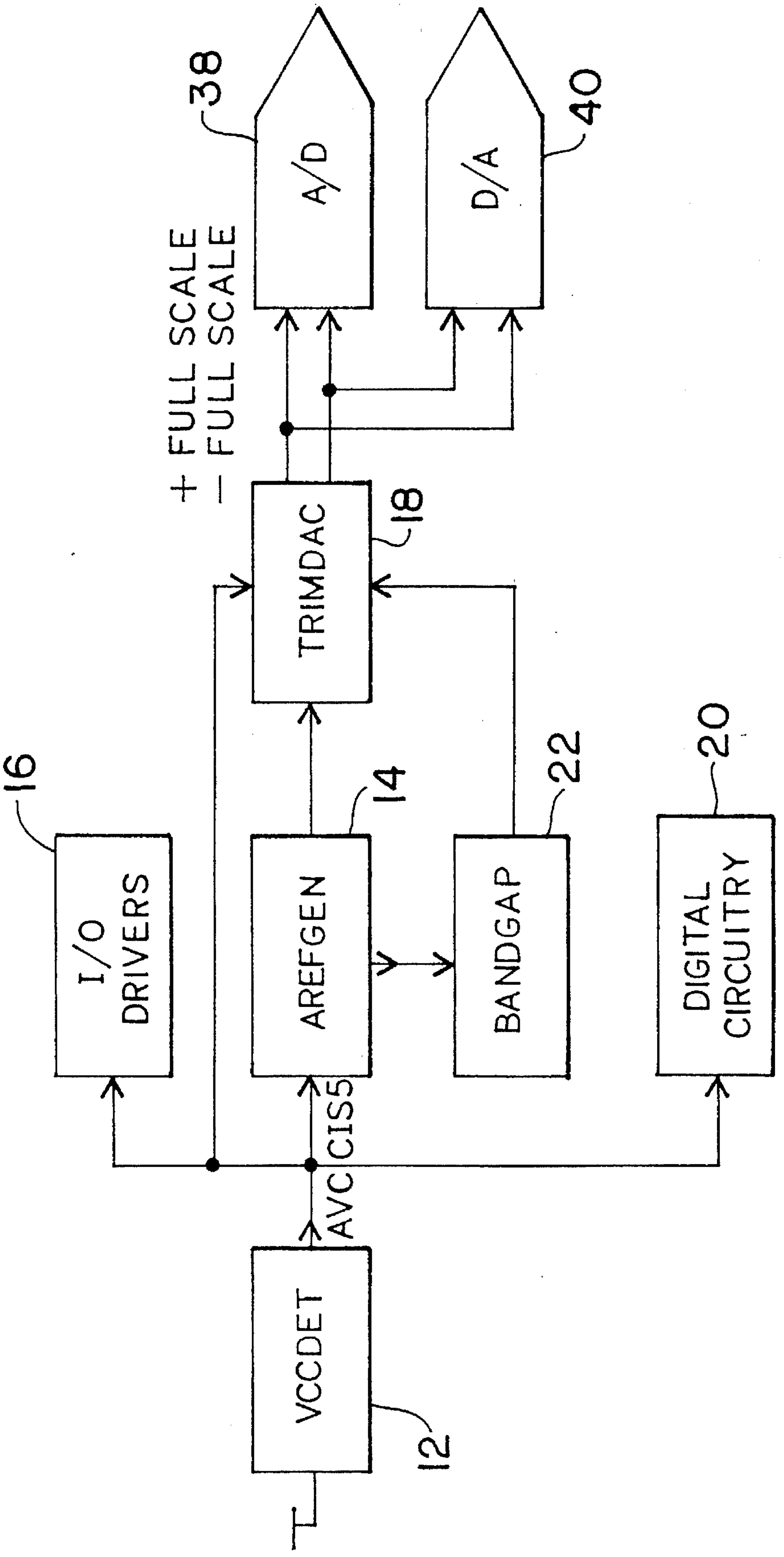
FIG. 1 is a block diagram showing the VCC detect circuitry and overall system implementation of the present invention.

The overall system implementation block diagram for the VCC voltage supply detection circuitry of the present invention is illustrated in FIG. 1. It should be understood that the present invention is preferably incorporated within a single monolithic audio processing integrated circuit, which includes A/D and D/A converter circuits within a codec, but the present invention may also be included in a separate integrated circuit device external to the monolithic audio processing integrated circuit. In the preferred embodiment, each block shown in FIG. 1 is implemented within a single monolithic integrated circuit codec device. In other embodiments, any one or more of these blocks may reside in a separate integrated circuit device which is electrically connected to the remaining blocks.

VCCDET block 12 determines if the audio processing integrated circuit, or chip, is operating within a 5.0 volt or a 3.3 volt system, and after making that determination, VCCDET block 12 sets a digital control signal AVCCIS5 to a logic '1' or logic '0' level. A logic '1' AVCCIS5 signal indicates that a 5.0 volt system is present. A logic '0' indicates a 3.3 volt supply environment. This control signal then controls the circuit selections within the various other digital and analog blocks in FIG. 1, as described below, such that optimum audio performance can be achieved for either a 3.3 volt or 5.0 volt system.

Figure 2:
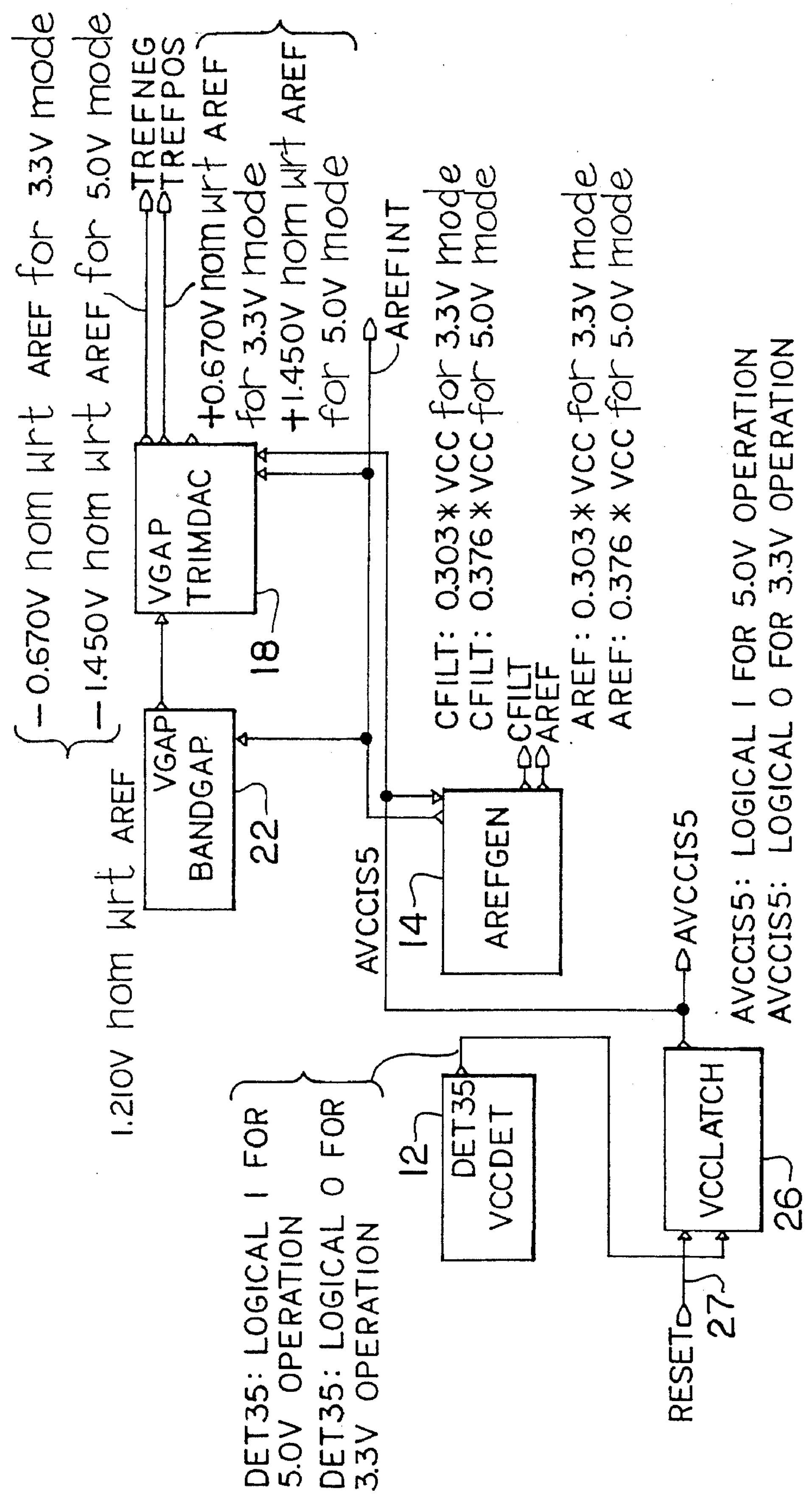
FIG. 2 is a block diagram illustration of the VCC detect circuitry of the present invention.

Referring to FIG. 2, VCCDET block 12 generates an output signal DET35 which is input to VCCLATCH block 26. VCCLATCH block 26 sets the state of control signal AVCCIS5 at the conclusion of a RESET signal 27, where RESET signal 27 is provided to VCCLATCH block 26 to provide a power-up reset function. At the end of the RESET signal, the state of signal AVCCIS5 is output from VCCLATCH block 26 as control signal AVCCIS5. In another embodiment, output signal DET35 can be used as control signal AVCCIS5 without utilizing VCCLATCH block 26 and the power-up RESET signal.

Control signal AVCCIS5 effects the output signal VGAP of BANDGAP block 22 since bandgap circuitry within BANDGAP block 22 is referenced to the output signal AREFINT of AREFGEN block 14, where signal AREFINT is a reference voltage determined by the state of control signal AVCCIS5. Control signal AVCCIS5 is used to control the selection of two full scale reference voltages, TREFNEG and TREFPOS, output by TRIMDAC block 18, which are preferably provided as analog reference voltages to sigma-delta A/D and D/A circuits within an audio processing integrated circuit. Control signal AVCCIS5 is used to set a larger full scale reference potential for the 5.0 volt operating system than for the 3.3 volt system to create the highest possible dynamic range and audio performance for the audio A/D and D/A circuitry.

Figure 3:
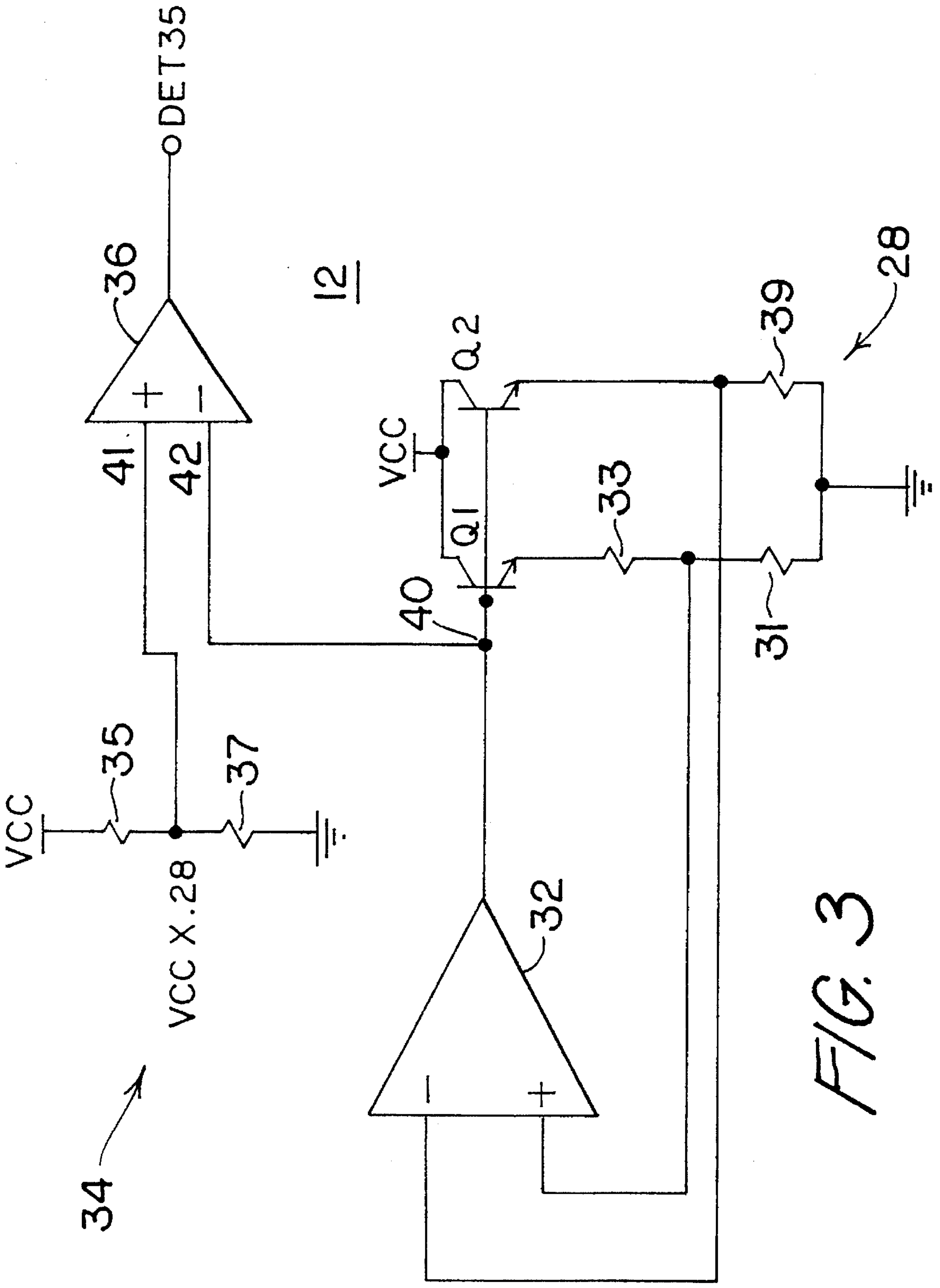
FIG. 3 is a schematic illustration of the VCC detect circuit (VCCDET) of the present invention.

Referring to FIG. 3, VCCDET block 12 detects the state of VCC to be 5.0 volts or 3.3 volts by using a bandgap voltage reference circuit 28 which includes reference op amp 32 and a pair of bipolar transistors Q1 and Q2. The emitter of transistor Q1 is tied to ground through resistors 33 and 31. The emitter of transistor Q2 is tied to ground through resistor 39.

The function of the voltage level of bandgap circuit output node 40 of reference op amp 32 is to represent a fixed reference potential with respect to ground, independent of power supply and temperature variations. This reference potential is connected to the negative input node 42 of comparator 36. Comparator 36 is a simple voltage comparator which can be chosen from those voltage comparators known in the art.

The positive input node 41 of comparator 36 is connected to the output of voltage divider network 34, where voltage divider network 34 includes resistor 35 connected to VCC and resistor 37 connected to ground. The voltage divider ratio is set so when VCC is midway between 5.0 volts and 3.3 volts, the output of the voltage divider network 34 equals the fixed reference potential on node 40. Thus, when VCC is 5.0 volts, node 41 is at a higher potential than node 42, and comparator 36 outputs a logic '1' on DET35. When VCC is 3.3 volts, node 41 is at a lower potential than node 42, and comparator 36 outputs a logic '0' on DET35. Output signal DET35, generated by comparator 36, is provided as an input signal to VCCLATCH block 26, previously discussed.

Figure 4:
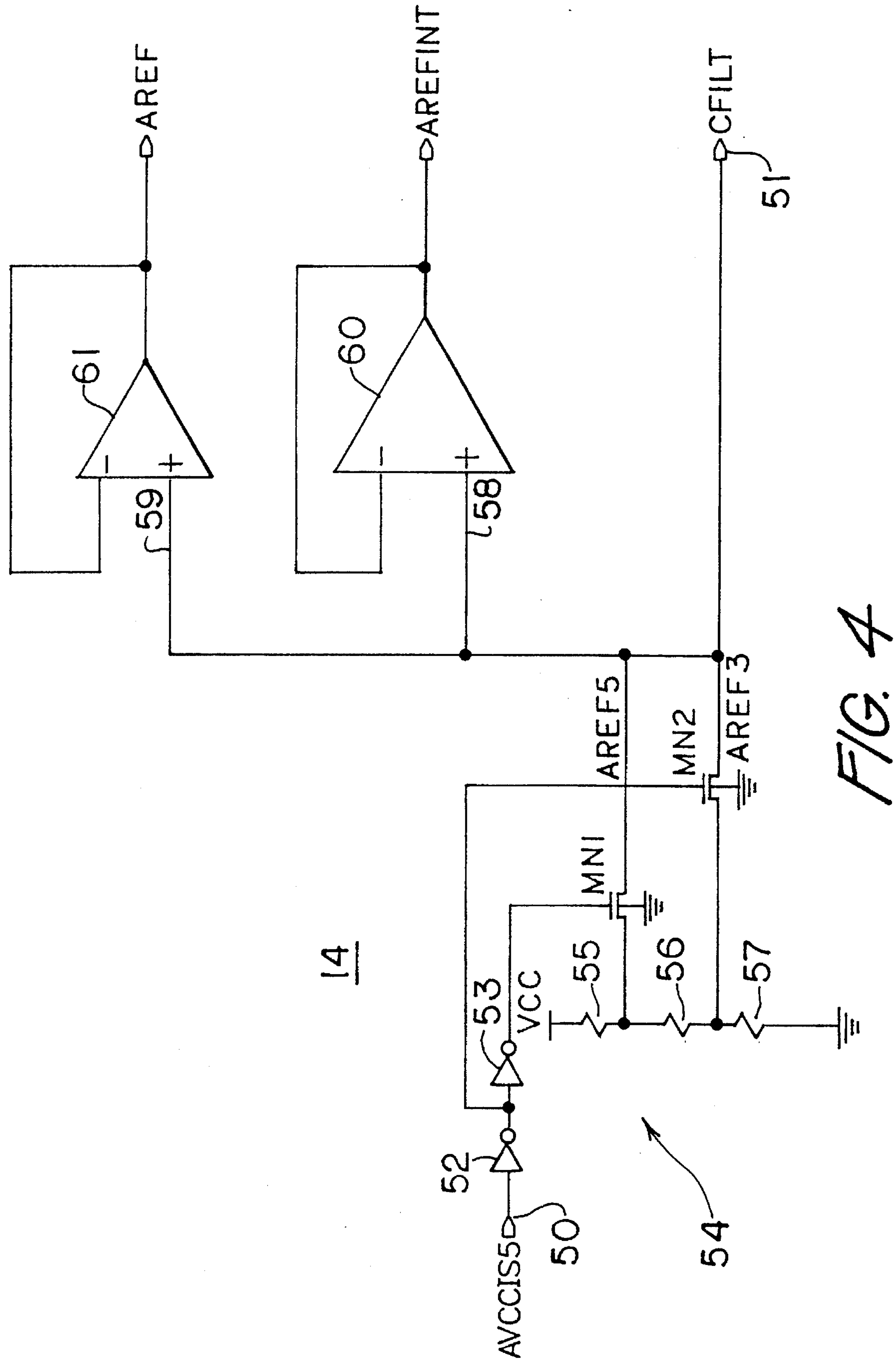
FIG. 4 is a schematic illustration of the analog reference generation circuitry (AREFGEN) of the present invention.

Referring to FIG. 4, AREFGEN block 14 creates an internal analog reference potential signal AREFINT, which is selectable between two voltage levels, one level when VCC=5.0 volts and the other level when VCC=3.3 volts. An external analog reference potential, AREF, identical to AREFINT, is also generated by AREFGEN block 14 for use by the user, or by an external system. An external capacitor, not shown, is connected to I/O pin 51 for analog reference signal source CFILT, for external filtering of the analog reference signal. This is accomplished since the value of the filter capacitor is typically too large for effective implementation within an integrated circuit device.

In operation, control signal AVCCIS5 is input to AREFGEN block 14 input node 50. Inverters 52 and 53 are used to buffer signal AVCCIS5. If signal AVCCIS5 is a logic '1', indicating VCC=5.0 volts, transistor MN2 is turned off and transistor MN1 is turned on creating a common mode reference signal AREF5, set by voltage divider network 54, to 0.376*VCC, so larger analog signal voltage swings can be obtained. This also sets analog reference signal source CFILT equal to 0.376*VCC: For AVCCIS5 as a logic '0', indicating VCC=3.3 volts, transistor MN1 is turned off and transistor MN2 is turned on and a common mode reference signal AREF3 is generated, via voltage divider network 54, having a voltage level set slightly closer to ground, at 0.303*VCC, to provide optimum signal swings for analog circuitry operating at 3.3 volts. This also sets analog reference signal source CFILT equal to 0.303*VCC.

As stated, common mode reference signals AREF5 and AREF3 are obtained via voltage divider network 54, which includes resistors 55–57. The ratio of the values of resistors 55–57 in network 54 provides the fractions of VCC at 0.376 and 0.303 for VCC=5.0 and 3.3 volts, respectively. The reference signal AREF5, selected if AVCCIS5=1, or reference signal AREF3, selected if AVCCIS5=0, is input to the positive input 58 of unity gain, noninverting op amp 60 and positive input 59 of unity gain, non-inverting op amp 61. Op amp 60 generates internal analog reference signal AREFINT which is equal to the value of AREF5 or AREF3 input on positive input 58 of op amp 60 and provides a current source and sink capability. Op amp 61 generates external analog reference signal AREF, which is equal in value to AREFINT, and also provides a current source and sink capability.

Figure 5:
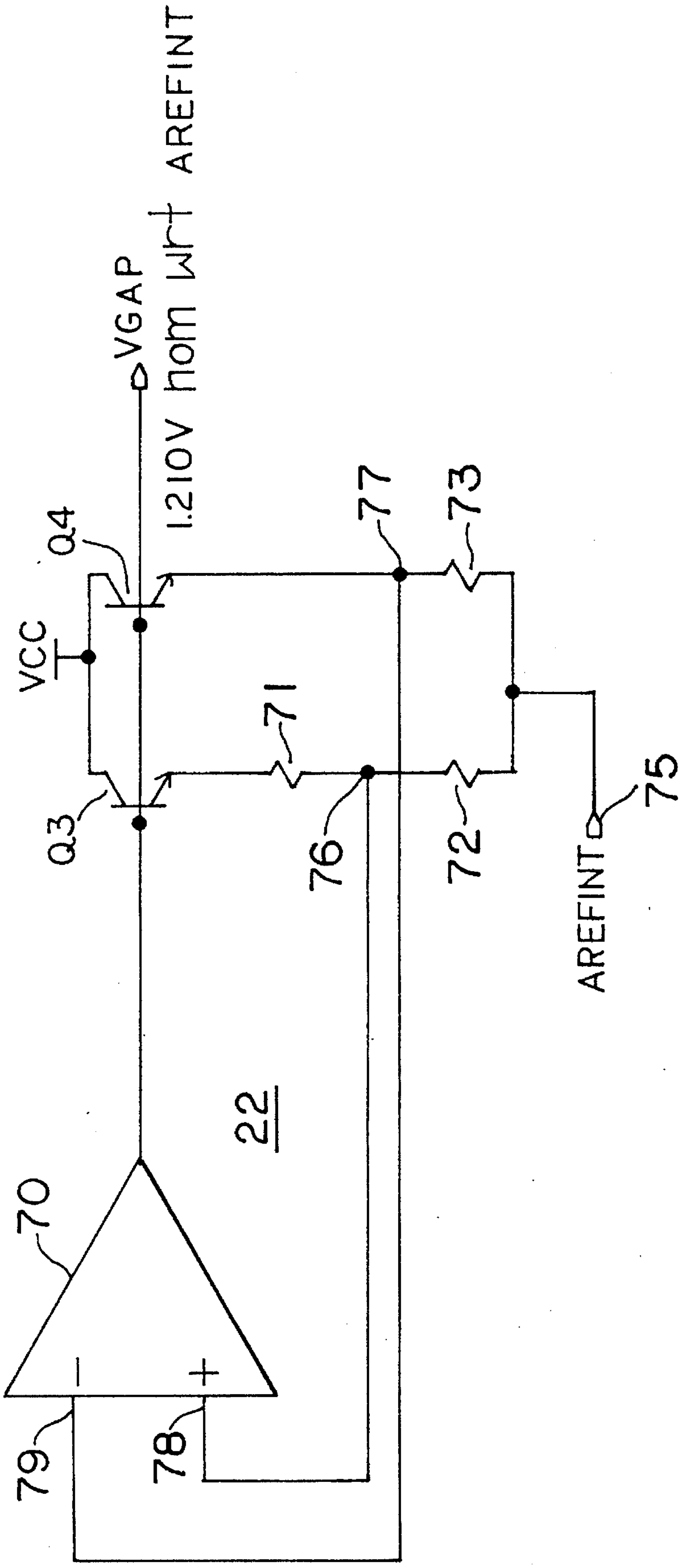
FIG. 5 is a schematic illustration of the band gap generator (BANDGAP) of the present invention.

Referring to FIG. 5, internal analog reference signal AREFINT, output from AREFGEN block 14, is input at BANDGAP block 22 input node 56. A bandgap voltage reference circuit, which includes reference op amp 70 and bipolar transistors Q3 and Q4, is utilized and is referenced by internal analog reference signal AREFINT. The emitter of transistor Q3 is connected to signal AREFINT via resistors 71 and 72. The emitter of transistor Q4 is connected to signal AREFINT through resistor 73. Bandgap reference voltage node 76 is connected to the positive input 78 of reference op amp 70. The negative input 79 of reference op amp 70 is connected to bandgap reference voltage node 77. Output voltage reference signal VGAP, generated by reference op amp 70, is thus referenced by signal AREFINT. Signal VGAP is set by the BANDGAP block 22 bandgap reference circuit to a voltage level of 1.210 volts+voltage level of AREFINT regardless of whether VCC=5.0 or 3.3 volts (where AREFINT=0.376*VCC, or AREFINT=0.303*VCC).

Figure 6:
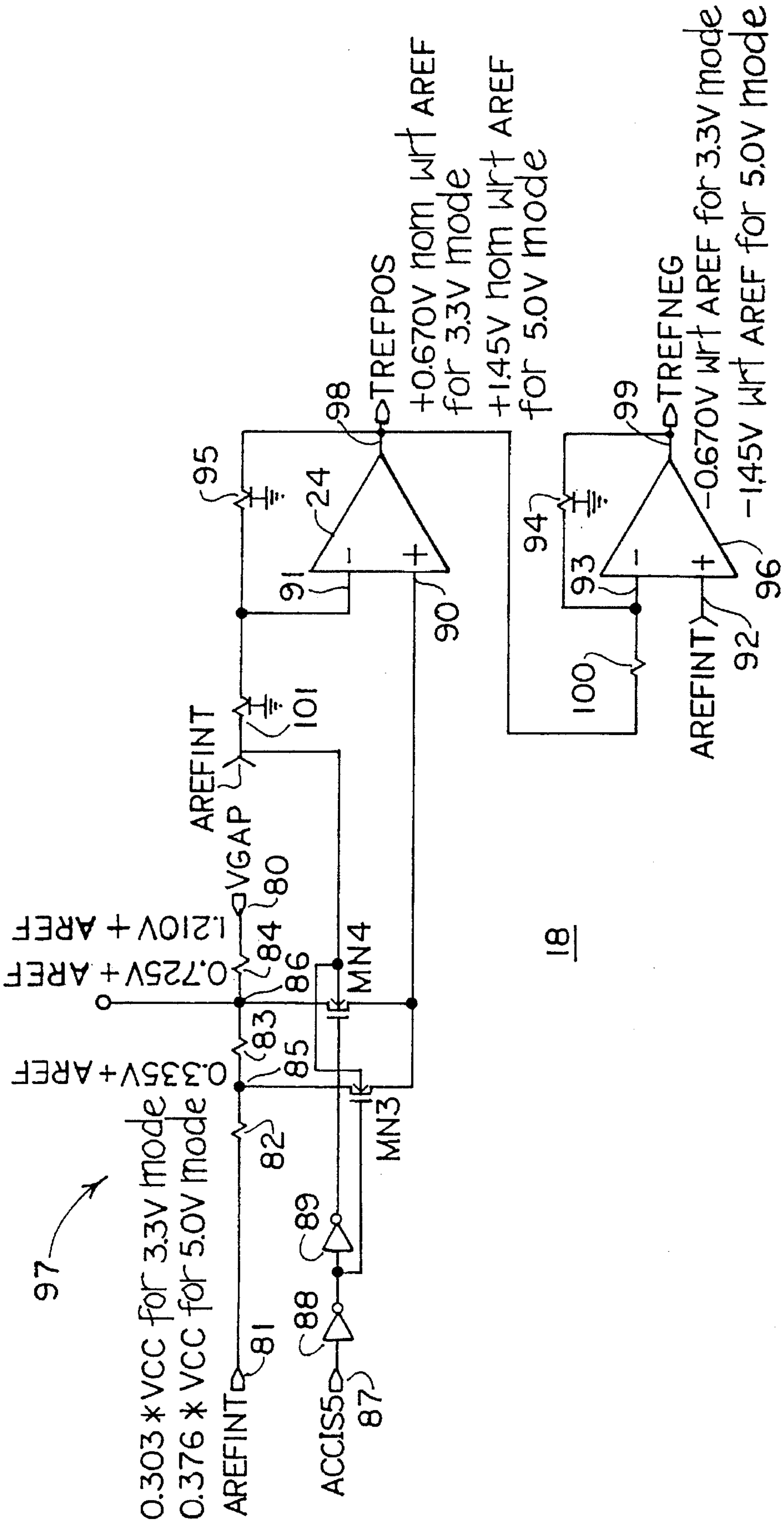
FIG. 6 schematically illustrates the analog reference generator circuit which generates a signal used to trim the A/D and D/A converters (TRIMDAC)

Referring to FIG. 6, control signal AVCCIS5 is input to TRIMDAC block 18 input node 52. A voltage divider network 97, which includes resistors 82–84, is connected via resistor 82 to internal analog reference voltage signal AREFINT at input node 81. The other end of the voltage divider network 97 is connected to output voltage reference signal VGAP at input node 80. Because signal VGAP is referenced to signal AREFINT, the difference in magnitude between the voltage level of these two signals is constant, regardless of the voltage level of VCC. The resistor divider network 97 also provides voltage tap nodes 85 and 86.

When control signal AVCCIS5 is a logic '1', for VCC=5.0 volts, transistor MN3 is turned off and transistor MN4 is turned on, via inverters 88 and 89, and the positive input 90 to non-inverting gain stage op amp 24 is set to the voltage level of voltage tap node 86, which has been set by the voltage divider network 97 to about 0.725 volts+the voltage level of reference signal AREFINT. When control signal AVCCIS5 is a logic '0', for VCC=3.3 volts, transistor MN4 is turned off and transistor MN3 is turned on, via inverters 88 and 89, and the positive input 90 to non-inverting gain stage op amp 24 is set to the voltage level of voltage tap node 85, which is has been set by the voltage divider network 97 to about 0.335 volts+the voltage level of reference signal AREFINT.

As illustrated in FIG. 1, TRIMDAC block 18 is utilized to provide analog reference signals to an A/D and/or D/A converter, preferably sigma-delta converters, which are connected to TRIMDAC block 18. Such reference signals may be used by the A/D and/or D/A converter to set a plus or minus full scale value for the converter. These signals, illustrated in FIG. 6 as TREFPOS and TREFNEG, are generated by non-inverting gain stage op amp 24 and unity gain, inverting op amp 54, respectively. Preferably, op amp 24 has a gain of two. During 5.0 volt operation, TREFNEG is equal to about −1.450 volts–voltage level of AREFINT (AREFINT=0.376*VCC), and TREFPOS is equal to about 1.450 volts+voltage level of AREFINT. During 3.3 volt operation, TREFNEG is equal to about −0.670 volts–voltage level of AREFINT (AREFINT=0.303*VCC), and TREFPOS is equal to about 0.670 volts+voltage level of AREFINT.

The output 98 of non-inverting gain stage op amp 24 is connected to the negative input 91 of op amp 24 via feedback resistor 95 and is connected to the negative input 93 of unity gain, inverting op amp 54 via input resistor 100. Internal analog reference signal AREFINT is also connected to the negative input 91 of op amp 24, via input resistor 101. The output 99 of op amp 54 is connected to the negative input 93 of op amp 54 via feedback resistor 94. The positive input 92 of op amp 54 is connected directly to internal analog reference signal AREFINT.

Preferably, control signal AVCCIS5 is provided as a single bit of data to a register within an audio processing integrated circuit which is in the same monolithic structure as the VCC detect circuitry of the present invention. An external processor reads the register contents to obtain the status of the AVCCIS5 bit within that register to determine whether the audio processing circuitry is operating within a 5.0 or 3.3 volt environment. Control and/or game software would thus be notified of the power supply voltage of the audio processing circuitry and could then perform certain steps depending on the operating voltage, e.g. perform power saving measures if a 3.3 volt operating system was detected.

Figure 7:
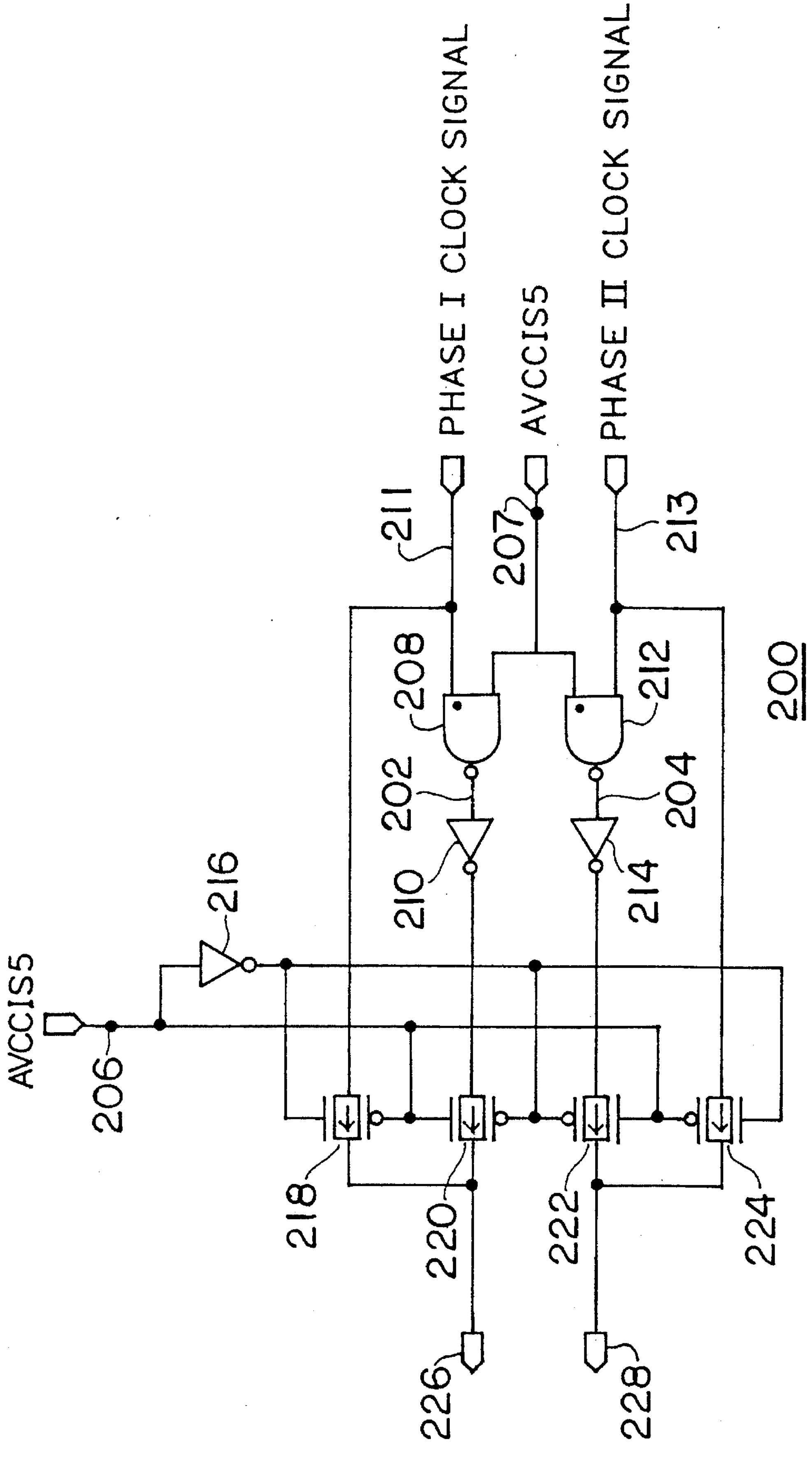
FIG. 7 is a block diagram of a clock generation delay circuit controlled by a control signal generated by the VCC detect circuit of the present invention.

In another embodiment, shown in FIG. 7, control signal AVCCIS5 is used in a clock generation circuit to adjust the delay in the clock generator to produce non-overlapping clock phases. The non-overlap time is determined by a propagation delay through the clock generation circuit. The clock generation circuit will have inherently more delay when VCC=3.3 volts than when VCC=5.0 volts. By using control signal AVCCIS5, a signal path for the clock phases can be selected to keep the absolute value of the delay relatively constant over the supply voltage variation. This prevents clock phases from having excessive non-overlap time at 3.3 volts.

As shown in FIG. 7, phase I clock signal 202 and phase II clock signal 204 are input to clock generation delay circuit 200. To maintain a relatively constant amount of delay for a signal as VCC varies from 3.3 to 5.0 volts, control signal AVCCIS5 is used to create less delay for a signal when VCC=3.3 volts, since circuits inherently operate at slower speeds and therefor, less delay is necessary. Control signal AVCCIS5 is input to circuit 200 at input node 206 and 207. When VCC=5.0 volts, AVCCIS5 is a logic '1'. In this mode, clock phase signal 211 is provided to NAND gate 208. AVCCIS5 is also provided to NAND gate 208 which enables NAND gate 208 to output an inverted phase I clock signal 202, which is then input to inverter 210 and is output from inverter 210 to transmission gate, switch, 220. Likewise, in this mode, phase II clock signal 213 is input to NAND gate 212 and then NAND gate 212 is enabled by control signal AVCCIS5 so that the output of NAND gate 212 is an inverted phase II clock signal 204. The inverted phase II clock signal 204 is input to inverter 214. The output of inverter 214 is input to transmission gate, switch, 222. AVCCIS5 is provided to transmission gates 218, 220, 222, and 224 directly and via inverter 216. In this mode, with VCC=5.0 volts, the switches 220 and 222 are enabled and switches 218 and 224 are disabled, so clock phase I signal 202 is output on node 226 and phase II clock signal 204 is output at node 228. Both signals have the propagation delays from passing through their respective delay path of NAND gates, inverters, and transmission gates.

In another operating mode, when VCC=3.3 volts, AVCCIS5 is a logic '0'. In this mode, NAND gates 208 and 212 are disabled by signal AVCCIS5. Phase I clock signal 211 is routed directly from the clock generation input 211 through transmission gate 218 to output 226 without being affected by propagation delays through NAND gate 208 and inverter 210. Likewise, phase II clock signal 213 is provided directly from the input 213 of clock generation circuit 200 through transmission gate 224 to output 228 without experiencing propagation delay through the delay path of NAND gate 212 and inverter 214.

Thus, by bypassing the respective NAND gates and inverters, the propagation delay through clock generation circuit 200 is controllable. This clock generation delay circuit 200 can, in other embodiments, have inputs other than clock signals. Any logic level signal can be input at inputs 211 or 213 and be output via delay path including switch 218, 220, 222 or 224, depending on the value of AVCCIS5. In other embodiments, the control signal AVCCIS5 could be used to select any signal paths in any circuit to provide any amount of delay.

This scheme of utilizing the AVCCIS5 control signal to select the amount of delay of a timing signal could be utilized in any delay critical circuit, such as a ROM, RAM, PLA, or non-overlapped delay clock generating circuitry. In an embodiment used for controlling delay critical functions in a RAM, the bit-line pre-charge, word-line enable, sense amp enable signals could be selected as described above, using the control signal AVCCIS5 to select an earlier delayed timing signal when operating at 3.3 volts.

Figure 8:
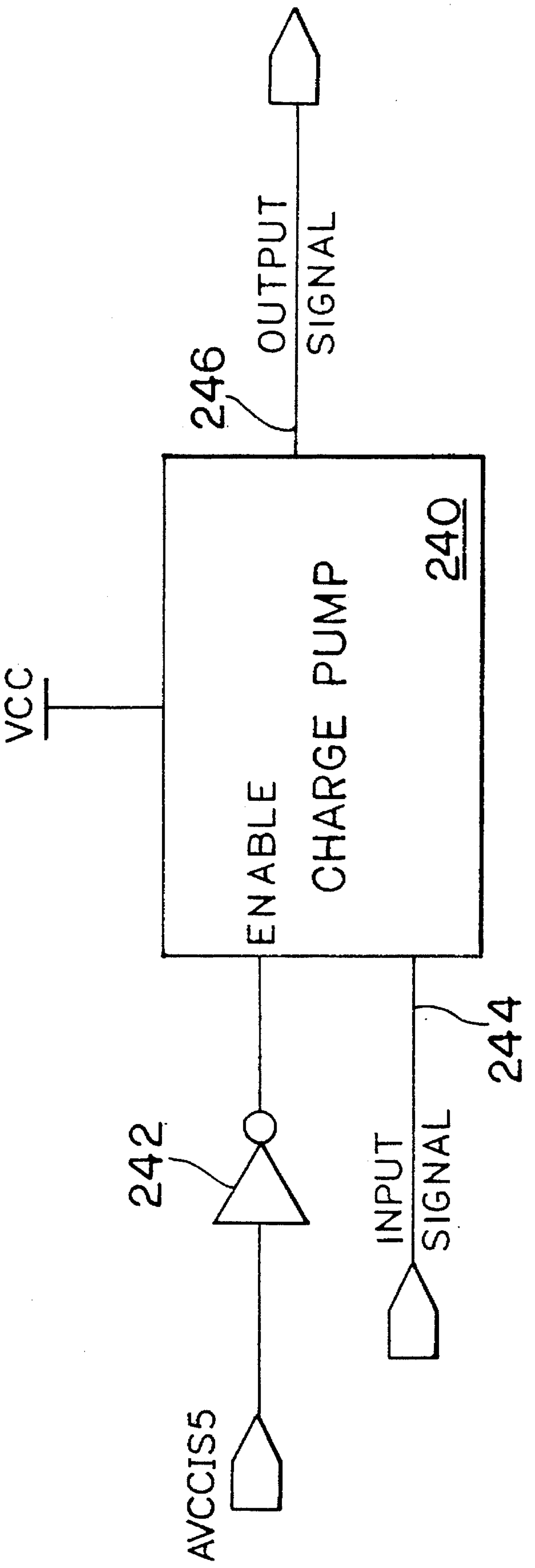
FIG. 8 is a block diagram illustration of a charge pump circuit utilizing a control signal generated by the VCC detect circuitry of the present invention.

In an alternative embodiment, shown in FIG. 8, control signal AVCCIS5 is utilized to disable a charge pump circuit 240 when VCC=5.0 volts. Charge pump circuits are generally known in the art and are used to develop an output Voltage in a circuit that is greater than the input voltage, where the input voltage e.g. is VCC. Charge pumps typically have applications in systems operating at a lower power supply voltage than the voltage level required at the output of a circuit operating at the lower supply voltage. Control signal AVCCIS5, generated by the VCC detect circuitry of the present invention, can be used to disable the charge pump 240 for circuitry controlled by the pump 240 in a 5.0 volt operating system, since 5.0 volt output signals are achieved without using charge pump. Thus, input signal 244 and output signal 246 have the same voltage level. This saves power consumed by the charge pump 240 and reduces noise caused by it.

When VCC=3.3 volts, control signal AVCCIS5 is a logic '0' and the charge pump 240 is enabled via inverter 242. The input signal 244 is acted on by charge pump 240 to create output signal 246, where the voltage level of input signal 244 is increased by charge pump 240 and is output as output signal 246.

In a still further embodiment, control signal AVCCIS5 could be used to select a higher clock frequency for circuitry (not shown) operating in a 5.0 volt system. Because circuits operate more slowly at 3.3 volts, such circuits cannot operate at higher clock speeds. Systems operating at 5.0 volts are inherently quicker, and therefore could run at faster clock speeds, where these faster clocks are selected by control signal AVCCIS5. This scheme, for example used with a microprocessor, would allow the processor to operate in 3.3 and 5.0 volt environments, with control signal AVCCIS5 being used to automatically select the faster clock for each operating mode to obtain maximum performance in both 3.3 volt and 5.0 volt operating systems. For VCC=5.0 volts, the fastest usable clock may be a 50 MHz clock. For 3.3 volts, the fastest usable clock may be a 25 or 30 MHz.

Control signal AVCCIS5 can be used to adjust the delay for control signals in a RAM, such as pre-charge, evaluate and sense amp (not shown). Typically, RAMs have a sequence of operation whereby pre-charge bit lines are enabled, then a word line is enabled to transfer data from the bit cells to the bit lines, then the sense amp is activated to amplify the data retrieved to a logic level. These operations often are timed using propagation delays. At different supply voltages, these propagation delays change. Control signal AVCCIS5 can be used to make the delay more constant over the different supply voltages by selecting a less delayed signal when operating at 3.3 volts than when operating at 5.0 volts. This scheme is similar to that of the clock generation delay circuit described above in regard to FIG. 7.

Figure 9:
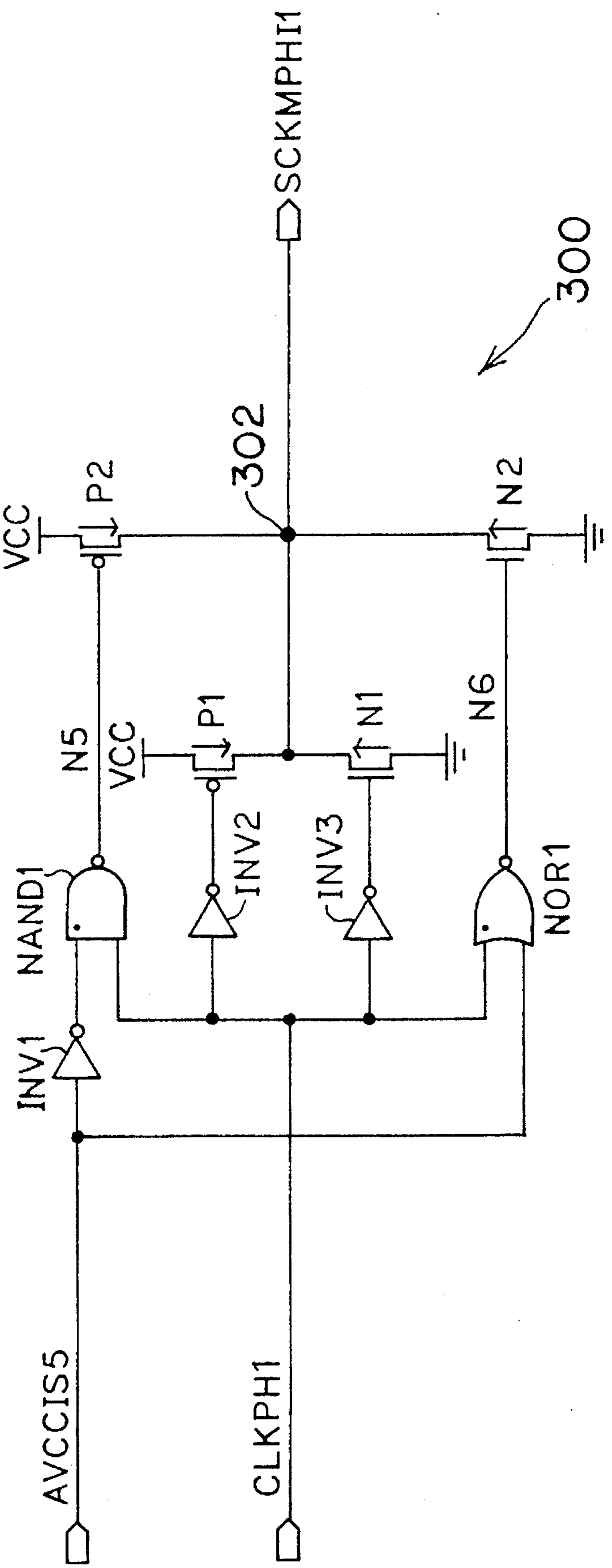
FIG. 9 schematically illustrates a selectable buffer driver circuit of the present invention.

FIG. 9 illustrates another embodiment, where control signal AVCCIS5 is used to alter the drive strength of a clock buffer 300. Clock buffers typically need to drive a large, relatively fixed capacitive load. At 3.3 volts, clock buffer 300 has less current available to switch the load, so it will normally require a longer time to switch the load than at 5.0 volts. In FIG. 9, a control circuit is illustrated that will increase the current drive of clock buffer 300 when VCC=3.3 volts, making the rise time of the clock signal CLKPH1 insensitive to the power supply level. When VCC=5.0 volts, AVCCIS5 is a logic '1' and is input to NAND1, making N5, the output, a logic '1', which disables transistor P2. AVCCIS5 as a logic '1' and is also input to NOR1, which causes its output N6, to be a logic '0', which disables transistor N2.

Clock signal CLKPH1 is input to NAND1, INV2, INV3 and NOR1. The outputs N 1 and N2 or INV2 and INV3, respectively, are equivalent logic values which are input to transistors P1 and N 1, respectively. P1 and N 1 are connected in an inverter driver configuration. The output of the inverter configuration, SCKMPHI1, has the same logic value as clock signal CLKPH1.

When VCC=3.3 volts, AVCCIS5=logic '0', and the output of INV1 is a logic '1' which enables NAND1, and NOR1 is also enabled. This allows NAND1 and NOR1 to output the logical inverse of output signal SCKMPHI1 to transistor P2 and to transistor N1, respectively. Transistors P1 and N1 are also configured as an inverter driver circuit in parallel with the inverter driver circuit formed by transistors P2 and N2, previously discussed. The output of inverter drivers P1, N 1 and P2, N2 are tied together at output node 302, which with the extra current drive from the P2, N2 inverter driver increases the current available to charge output signal SCKMPHI1, keeping the rise time of the signal approximately the same as when VCC=5.0 volts. In addition to maintaining the rise time approximately constant for VCC=3.3 or 5.0 volts, the use of inverter P2, N2 has the added benefit of reducing the power consumption and noise of clock buffer 300 when VCC=5.0 volts, since inverter P2, N2 is disabled and does not consume power.

Additionally, many complex integrated circuit devices, such as microprocessors and monolithic audio processing integrated circuits, include on-chip firmware which, on system startup, will perform different operations, such as power saving functions, depending on whether a 3.3 volt or 5.0 volt system is present. Control signal AVCCIS5 can be used to provide such firmware with initial operating condition information regarding the value of VCC.

The foregoing disclosure and description of the invention are illustrated and explanatory of the preferred embodiments, and changes in the components, circuit elements, or connections may be made without departing from the spirit of the invention.

What is claimed is:

1. A method of controlling a charge pump circuit, comprising the steps of:

providing a charge pump circuit;

providing a supply voltage (VCC) to said charge pump circuit;

providing at least one input signal to said charge pump circuit;

providing a VCC control signal to said charge pump circuit, wherein said control signal is at a first logic state when said supply voltage is equal to about 5.0 volts and is at a second logic state when said supply voltage is equal to about 3.3 volts;

generating at least one corresponding output signal having an increase voltage level from said at least one input signal only when said control signal is at said second logic state; and outputting said at least one output signal.

2. The method of claim 1, wherein said first logic state is a logic '1' and said second logic state is a logic '0'.

* * * * *